United States Patent
Ping et al.

(10) Patent No.: US 11,974,427 B2
(45) Date of Patent: Apr. 30, 2024

(54) MANUFACTURING METHOD OF A MEMORY AND A MEMORY

(71) Applicant: CHANGXIN MEMORY TECHNOLOGIES, INC., Hefei (CN)

(72) Inventors: Er-Xuan Ping, Hefei (CN); Zhen Zhou, Hefei (CN); Lingguo Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 365 days.

(21) Appl. No.: 17/456,571

(22) Filed: Nov. 24, 2021

(65) Prior Publication Data
US 2022/0085032 A1 Mar. 17, 2022

Related U.S. Application Data

(63) Continuation of application No. PCT/CN2021/106848, filed on Jul. 16, 2021.

(30) Foreign Application Priority Data

Sep. 9, 2020 (CN) .......................... 202010942805.3

(51) Int. Cl.
*H01L 21/768* (2006.01)
*H10B 12/00* (2023.01)

(52) U.S. Cl.
CPC ........... *H10B 12/482* (2023.02); *H10B 12/30* (2023.02)

(58) Field of Classification Search
CPC .. H10B 12/482; H10B 12/30; H10B 12/0335; H10B 12/315
See application file for complete search history.

(56) References Cited

U.S. PATENT DOCUMENTS

| | | | |
|---|---|---|---|
| 7,648,875 B2 | 1/2010 | Hong | |
| 7,767,569 B2 | 8/2010 | Maekawa | |
| 7,846,827 B2 | 12/2010 | Kim | |
| 8,748,254 B2 | 6/2014 | Lee | |

(Continued)

FOREIGN PATENT DOCUMENTS

| | | |
|---|---|---|
| CN | 1959953 A | 5/2007 |
| CN | 101075093 A | 11/2007 |

(Continued)

OTHER PUBLICATIONS

Notice of Restriction Requirement of the U.S. Appl. No. 17/479,162, dated May 8, 2023. 8 pages.

(Continued)

*Primary Examiner* — Samuel A Gebremariam
(74) *Attorney, Agent, or Firm* — Syncoda LLC; Feng Ma

(57) ABSTRACT

A manufacturing method of a memory includes: providing a substrate and a bit line contact layer; forming a dummy bit line structure on top of the bit line contact layer; forming a spacer layer on the sidewall of both the dummy bit line structure and the bit line contact layer; forming a dielectric layer on the sidewall of the spacer layer; forming a sacrificial layer filling the area between adjacent dummy bit line structures, wherein the sacrificial layer covers the sidewall of the dielectric layer; after the sacrificial layer is formed, removing the dummy bit line structure; forming a bit line conductive portion which fills the hole and covers the bit line contact layer; and, after the bit line conductive portion is formed, removing the spacer layer.

16 Claims, 7 Drawing Sheets

(56) References Cited

U.S. PATENT DOCUMENTS

| | | |
|---|---|---|
| 9,691,700 B2 | 6/2017 | Kuroki |
| 9,837,490 B2 | 12/2017 | Park et al. |
| 10,181,473 B2 | 1/2019 | Feng et al. |
| 10,453,849 B2 | 10/2019 | Liou et al. |
| 10,461,153 B2 | 10/2019 | Lee et al. |
| 10,600,790 B2 | 3/2020 | Feng et al. |
| 10,622,249 B2 | 4/2020 | Yoon |
| 10,763,264 B2 | 9/2020 | Liou et al. |
| 10,886,276 B2 | 1/2021 | Hwang |
| 10,923,390 B2 | 2/2021 | Yoon |
| 2006/0146595 A1 | 7/2006 | Hong et al. |
| 2006/0148227 A1 | 7/2006 | Kronke |
| 2007/0096188 A1 | 5/2007 | Maekawa |
| 2010/0233878 A1 | 9/2010 | Kim |
| 2012/0043642 A1 | 2/2012 | Kuroki |
| 2013/0052787 A1 | 2/2013 | Lee |
| 2017/0005166 A1 | 1/2017 | Park et al. |
| 2017/0084613 A1 | 3/2017 | Hwang |
| 2018/0226408 A1 | 8/2018 | Feng et al. |
| 2019/0019805 A1 | 1/2019 | Feng et al. |
| 2019/0088739 A1 | 3/2019 | Lee et al. |
| 2019/0103302 A1 | 4/2019 | Yoon |
| 2019/0273083 A1 | 9/2019 | Liou et al. |
| 2020/0013783 A1 | 1/2020 | Liou et al. |
| 2020/0203213 A1 | 6/2020 | Yoon |
| 2021/0035613 A1 | 2/2021 | Park |

FOREIGN PATENT DOCUMENTS

| | | |
|---|---|---|
| CN | 103730435 A | 4/2014 |
| CN | 102347331 B | 12/2015 |
| CN | 102543944 B | 6/2016 |
| CN | 107482007 A | 12/2017 |
| CN | 107611133 A | 1/2018 |
| CN | 107611133 B | 8/2018 |
| CN | 108389860 A | 8/2018 |
| CN | 109148376 A | 1/2019 |
| CN | 109244090 A | 1/2019 |
| CN | 109524383 A | 3/2019 |
| CN | 109962018 A | 7/2019 |
| CN | 109979940 A | 7/2019 |
| CN | 209216973 U | 8/2019 |
| CN | 110223982 A | 9/2019 |
| CN | 110491880 A | 11/2019 |
| CN | 110890365 A | 3/2020 |
| CN | 110957320 A | 4/2020 |

OTHER PUBLICATIONS

First Office Action of the U.S. Appl. No. 17/487,622, dated May 25, 2023. 37 pages.
International Search Report (ISR) in Application No. PCT/CN2020/106848, dated Oct. 19, 2021.
Written Opinion of the International Search Authority in the international application No. PCT/CN2021/106848, dated Oct. 19, 2021.
International Search Report in the international application No. PCT/CN2021/103820, dated Aug. 31, 2021.
Written Opinion of the International Search Authority in the international application No. PCT/CN2021/103820, dated Aug. 31, 2021.
International Search Report in the international application No. PCT/CN2021/103864, dated Oct. 11, 2021.
Written Opinion of the International Search Authority in the international application No. PCT/CN2021/103864, dated Oct. 11, 2021.
International Search Report in the international application No. PCT/CN2021/100327, dated Sep. 9, 2021.
Written Opinion of the International Search Authority in the international application No. PCT/CN2021/100327, dated Sep. 9, 2021.
Notice of Allowance of the Chinese application No. 202011018109.X, dated Dec. 28, 2022.

MANUFACTURING METHOD OF A MEMORY AND A MEMORY

CROSS-REFERENCE TO RELATED APPLICATIONS

This is a continuation of International Patent Application No. PCT/CN2021/106848 filed on Jul. 16, 2021, which claims priority to Chinese Patent Application No. 202010942805.3 filed on Sep. 9, 2020. The above-referenced applications are incorporated herein by reference in their entirety.

BACKGROUND

A memory is a memory device used to store programs and various data information. A Random-Access Memory comprises a Static Random-Access Memory and a Dynamic Random-Access Memory. A Dynamic Random-Access Memory generally comprises a capacitor and a transistor connected thereto. The capacitor is used to store charges representing stored information, and the transistor is a switch that controls the charge inflow and release of the capacitor. When writing data, the word line gives a high level, the transistor is turned on, and the bit line charges the capacitor. When reading data, the word line also gives a high level, the transistor is turned on, and the capacitor discharges, enabling the bit line to acquire a read-out signal.

However, with the continuous reduction of a memory process node, the performance of memory needs to be improved.

SUMMARY

The embodiments of the present disclosure relate to the field of semiconductors, and in particular to a manufacturing method of a memory and a memory.

The embodiments of the present disclosure provide a manufacturing method of a memory. The manufacturing method of a memory comprises the steps of: providing a substrate and a plurality of discrete bit line contact layers, wherein the substrate has a plurality of active regions and each of the bit line contact layers is electrically connected to the active region; forming a dummy bit line structure on top of the bit line contact layer; forming a spacer layer on the sidewall of both the dummy bit line structure and the bit line contact layer; forming a dielectric layer on the sidewall of the spacer layer; forming a sacrificial layer filling the area between adjacent dummy bit line structures, wherein the sacrificial layer covers the sidewall of the dielectric layer; after the sacrificial layer is formed, removing the dummy bit line structure to form a hole which exposes the bit line contact layer; forming a bit line conductive portion which fills the hole and covers the bit line contact layer; and, after the bit line conductive portion is formed, removing the spacer layer to form a gap between the dielectric layer and the bit line conductive portion.

The embodiments of the present disclosure also provide a memory manufactured by adopting the manufacturing method as previously described. The memory comprises: a substrate and a plurality of discrete bit line contact layers, wherein the substrate has a plurality of active regions and each of the bit line contact layers is electrically connected to the active region; a bit line conductive portion located on top of the bit line contact layer; a dielectric layer located on the periphery of the sidewall of the bit line conductive portion; and a gap between the dielectric layer and the bit line conductive portion.

BRIEF DESCRIPTION OF THE DRAWINGS

One or more embodiments are illustrated by way of example with reference to the accompanying drawings, which are not to be limiting to the embodiments, and the figures in the drawings are not to be limiting to scale unless specifically stated.

DETAILED DESCRIPTION

As can be seen in the Background Art, the performance of the memory of the related art needs to be improved.

It is found that the main reasons for the above problems include: the spacing between the bit lines becomes increasingly narrow with the continuous reduction of a process node, which leads to increasing parasitic capacitance between the bit lines and in turn leads to slow operating speed and high power consumption for the memory. Additionally, when the bit line structure is formed by etching, a plurality of non-volatile impurities will remain in the bit line structure; and excessive impurities will increase the resistance of the bit line structure, which in turn leads to slow operating speed for the memory. Additionally, as the width of the bit line structure is increasingly narrow, the bit line structure formed by etching is prone to tilt and collapse, which in turn affects the yield and service life of the memory.

To solve the above problems, the embodiments of the present disclosure provide a manufacturing method of a memory, which reduces the parasitic capacitance of the memory by forming a gap between the bit line conductive portion and the dielectric layer. Additionally, the bit line conductive portion is formed by filling the hole, thereby avoiding the formation of the bit line conductive portion by etching and reducing the proportion of impurities generated by etching in the bit line conductive portion, which in turn reduces the resistance of the bit line conductive portion. Additionally, as the bit line conductive portion is supported by the sacrificial layers in its formation, it is less prone to tilt or collapse and has a higher yield and a longer service life.

In order to further clarify the purpose, technical schemes and advantages of the embodiments of the present disclosure, the embodiments of the present disclosure will be described in detail with reference to the accompanying drawings. However, one of ordinary skill in the art will appreciate that in various embodiments of the present disclosure a plurality of technical details have been presented for readers to better understand this application. However, even without these technical details and various changes and modifications based on the following embodiments, the technical schemes claimed herein may be realized.

The first embodiment of the present disclosure provides a manufacturing method of a memory, and FIGS. 1 to 16 are schematic illustrations corresponding to each step in the manufacturing method.

Figure 1:
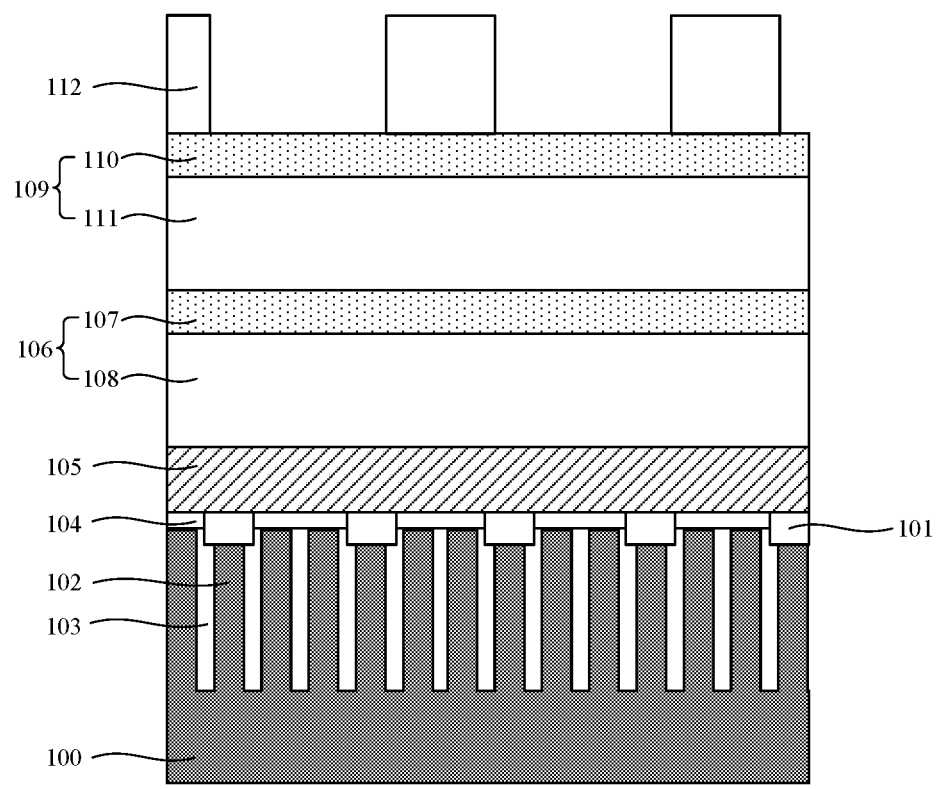
FIG. 1 is a first schematic illustration corresponding to a step in the manufacturing method of the memory provided by the first embodiment of the present disclosure.

Referring to FIG. 1, providing a substrate 100 having a plurality of active regions 102 within it, and a plurality of discrete bit line contact layers 101 wherein each bit line contact layer 101 is electrically connected to the active region 102.

The material of the substrate 100 comprises silicon, germanium, or other semiconductor materials.

The region between adjacent active regions 102 is filled with a first isolation layer 103 for isolating a plurality of active regions 102. The material of the first isolation layer 103 is an insulating material, for example silicon dioxide.

In some embodiments, each bit line contact layer 101 is partially inside the substrate 100 and partially above the surface of the substrate 100. The bit line contact layer 101 is partially embedded in the substrate 100 so that the parasitic capacitance of the memory can be reduced and the performance thereof can be improved. In other embodiments, the bit line contact layer may also be located on the substrate surface.

The material of the bit line contact layer 101 is a conductive material, for example polysilicon.

In some embodiments, a second isolation layer 104 may also be formed on the surface of the substrate 100. The second isolation layer 104 fills a region between the discrete bit line contact layers 101 for isolating a plurality of bit line contact layers 101; and the top of the second isolation layer 104 may be flush with the top of the bit line contact layer 101.

The material of the second isolation layer 104 is an insulating material, for example silicon nitride.

With reference to FIGS. 1 to 6 a dummy bit line structure 117 is formed on top of the bit line contact layer 101.

The dummy bit line structure 117 is used to define the position and size of the subsequently formed bit line structure, that is, the size of the dummy bit line structure 117 is the same as the size of the subsequently formed bit line structure. Since the dummy bit line structure 117 does not need to have conductive features, an insulating material may be employed as the material of the dummy bit line structure 117.

In some embodiments, the formation of the dummy bit line structure 117 comprises the steps of: forming a dummy bit line layer 105 on the substrate 100, wherein the dummy bit line layer 105 covers the bit line contact layer 101; forming a patterned mask layer 115 on the dummy bit line layer 105; and etching the dummy bit line layer 105 with the patterned mask layer 115 as a mask to form a dummy bit line structure 117.

In an exemplary embodiment, the dummy bit line structure 117 is formed by a Self-aligned Double Patterning (SADP) method.

The forming method of the dummy bit line structure 117 will be described in detail below with reference to the accompanying drawings.

Referring to FIG. 1, a dummy bit line layer 105 is formed on the substrate 100, wherein the dummy bit line layer 105 covers the bit line contact layer 101.

An underlying mask layer 106 and a core layer 109 stacked in sequence are formed on the dummy bit line layer 105. In this embodiment, the underlying mask layer 106 comprises a first underlying mask layer 107 and a second underlying mask layer 108.

The material of the first underlying mask layer 107 is different from that of the second underlying mask layer 108, and in particular, the material of the first underlying mask layer 107 may be silicon oxynitride while the material of the second underlying mask layer 108 may be hydrogen-containing silicon oxide.

It will be understood that in other embodiments the underlying mask layer may also have a single-layer structure.

In some embodiments, the core layer 109 comprises a first core layer 110 and a second core layer 111. The material of the first core layer 110 includes silicon oxynitride. The material of the second core layer 111 includes hydrogen-containing silicon oxide.

In other embodiments, the core layer may also have a single-layer structure.

A patterned photoresist layer 112 is formed on the core layer 109.

Figure 2:
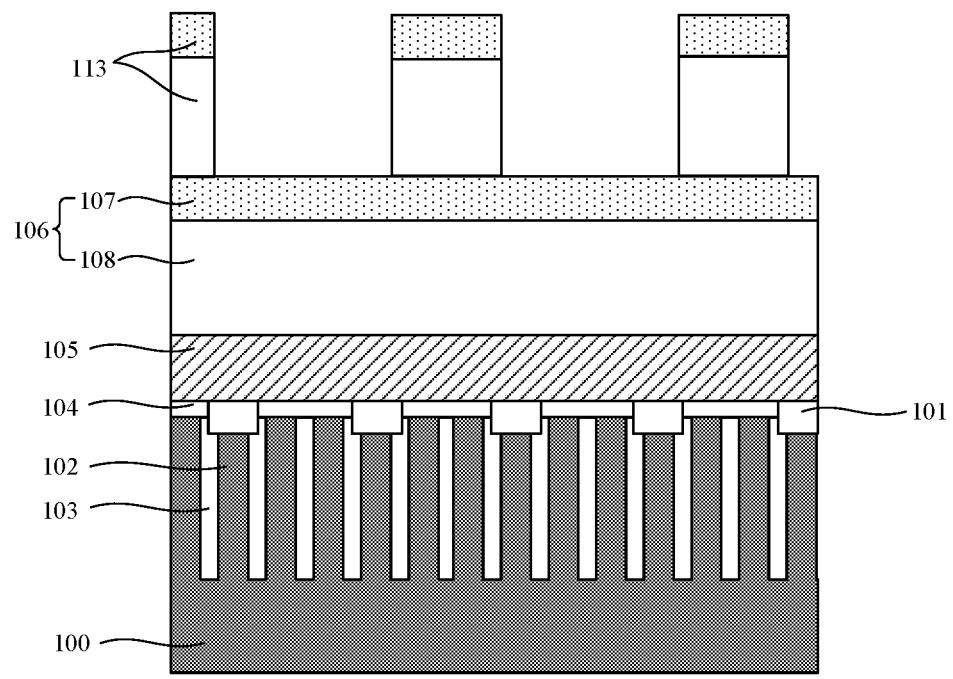
FIG. 2 is a second schematic illustration corresponding to a step in the manufacturing method of the memory provided by the first embodiment of the present disclosure.

Referring to FIG. 2, the core layer 109 (refer to FIG. 1) is etched with the patterned photoresist layer 112 (refer to FIG. 1) as a mask to form a plurality of discrete core portions 113. The core portion 113 has a double-layer structure and, in other embodiments it may also have a single-layer structure.

After the core portion 113 is formed, the patterned photoresist layer 112 is removed.

Figure 3:
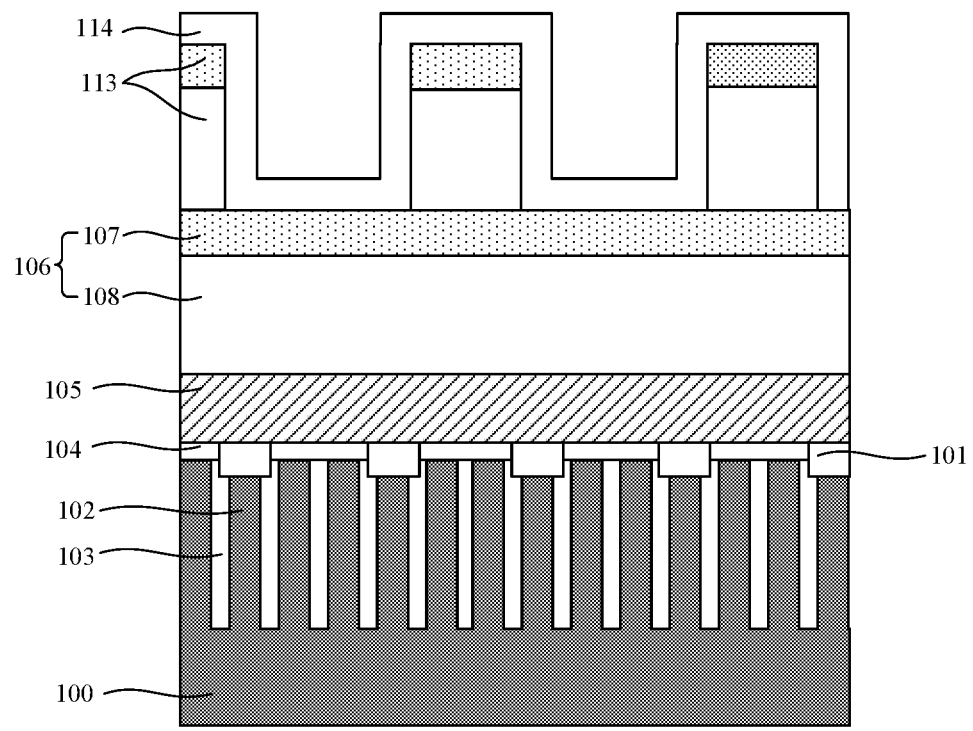
FIG. 3 is a third schematic illustration corresponding to a step in the manufacturing method of the memory provided by the first embodiment of the present disclosure.

Referring to FIG. 3, a sidewall film 114 is formed, wherein it covers the top and the sidewall of the core portion 113 and the underlying mask layer 106.

In some embodiments, the sidewall film 114 is deposited by utilizing atomic layer deposition techniques; and the sidewall film 114 formed thereby is more uniform in thickness. In other embodiments, the sidewall film may be formed by utilizing methods of chemical vapor deposition, physical vapor deposition or the like.

The material of the sidewall film 114 is different from that of the core portion 113 and may be silicon oxide for example.

Figure 4:
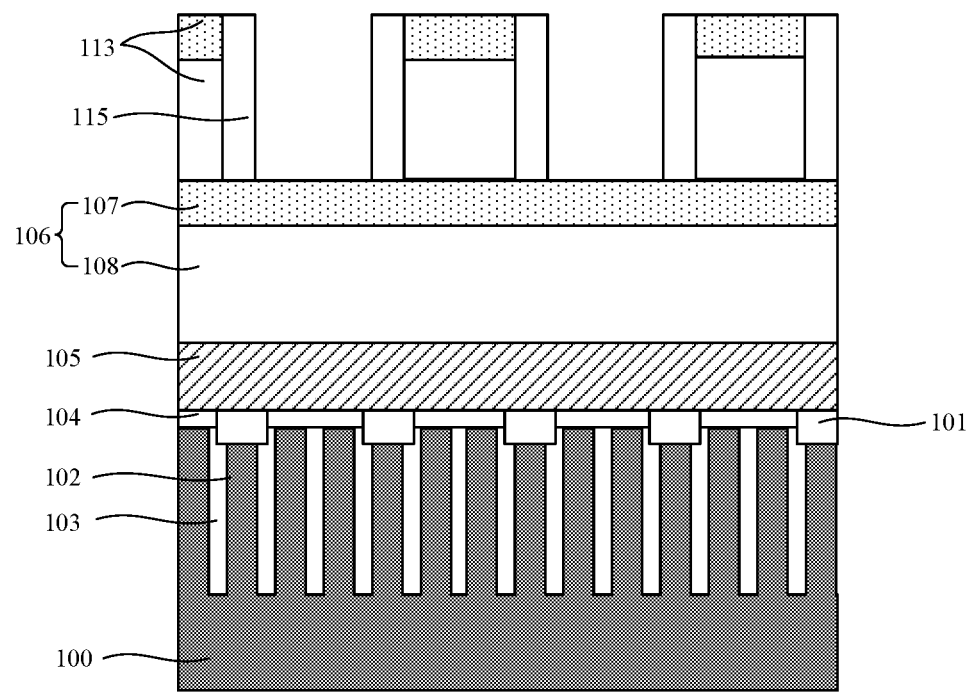
FIG. 4 is a fourth schematic illustration corresponding to a step in the manufacturing method of the memory provided by the first embodiment of the present disclosure.

Referring to FIG. 4, the sidewall film 114 (refer to FIG. 3) is etched to form sidewall layers 115 located on the opposing sidewalls of the core portion 113. Due to the etching loading effect, that is, the larger the etching area is, the easier it is to be etched, the sidewall film 114 (refer to FIG. 3) deposited on the sidewall of the core portion 113 is not prone to be etched, thereby forming the sidewall layer 115.

Figure 5:
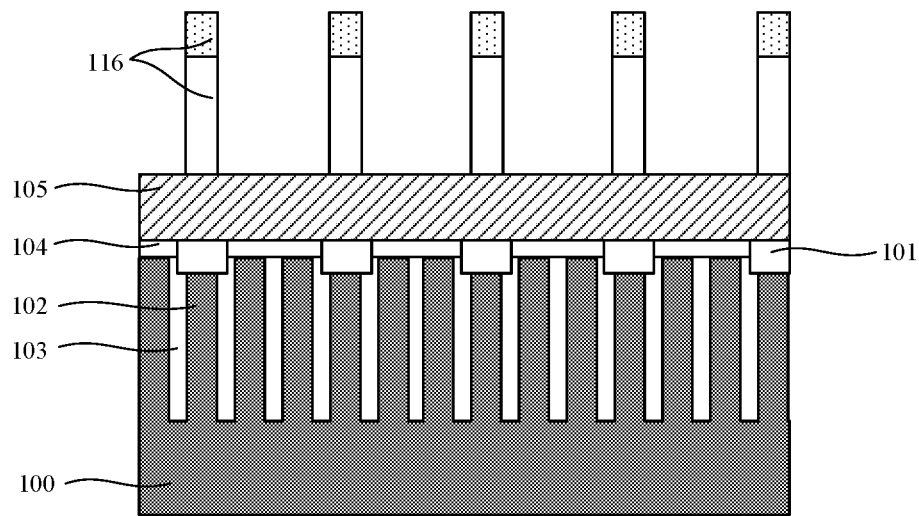
FIG. 5 is a fifth schematic illustration corresponding to a step in the manufacturing method of the memory provided by the first embodiment of the present disclosure.

Referring to FIG. 5, the core portion 113 (refer to FIG. 4) is removed and the sidewall layer 115 serves as a patterned mask layer 115.

The underlying mask layer 106 (refer to FIG. 4) is etched using the patterned mask layer 115 as a mask to form a patterned underlying mask layer 116. In an exemplary embodiment, the patterned underlying mask layer 116 has a double-layer structure. In other embodiments, the patterned underlying mask layer may also have a single-layer structure.

Figure 6:
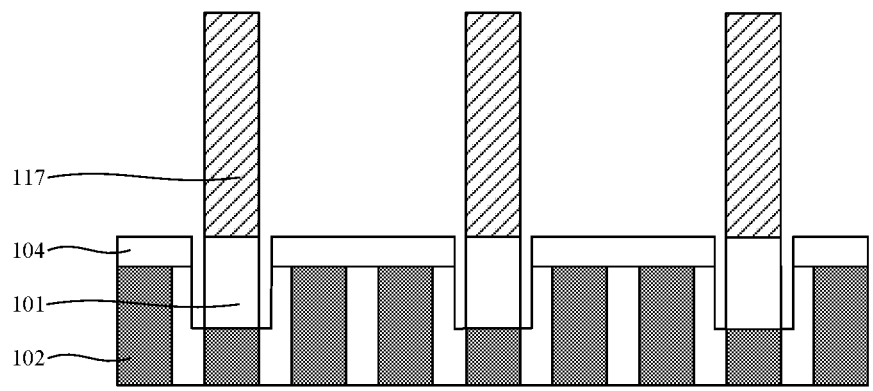
FIG. 6 is a sixth schematic illustration corresponding to a step in the manufacturing method of the memory provided by the first embodiment of the present disclosure.

Referring to FIG. 6, the dummy bit line layer 105 (refer to FIG. 5) is etched using the patterned underlying mask layer 116 (refer to FIG. 5) as a mask to form a dummy bit line structure 117. After the dummy bit line structure 117 is formed, the patterned underlying mask layer 116 is removed.

In some embodiments the patterned mask layer 115 (refer to FIG. 4) passes the pattern to the dummy bit line structure 117 through the patterned underlying mask layer 116. Therefore, the width of the dummy bit line structure 117 coincides with the width of the patterned mask layer 115, and the smaller the width of the patterned mask layer 115 is, the smaller the width of the dummy bit line structure 117 is, hence the smaller the size of the memory is.

The material of the dummy bit line structure 117 includes silicon nitride, silicon oxynitride, or silicon carbon nitride.

It should be noted that in other embodiments, the dummy bit line structure may also be formed without adopting the SADP process, for example: directly forming a single hard mask layer on the dummy bit line layer and lithographing the hard mask layer to form a plurality of discrete core portions on the dummy bit line layer; forming a sidewall film covering the top and sidewall of the core portion and the dummy bit line layer; etching the side wall film to form sidewall layers located on the opposing sidewalls of the core portion; and removing the core portion, wherein the sidewall layer serves as the patterned mask layer, and etching the dummy bit line layer with the patterned mask layer to form a dummy bit line structure.

Figure 7:
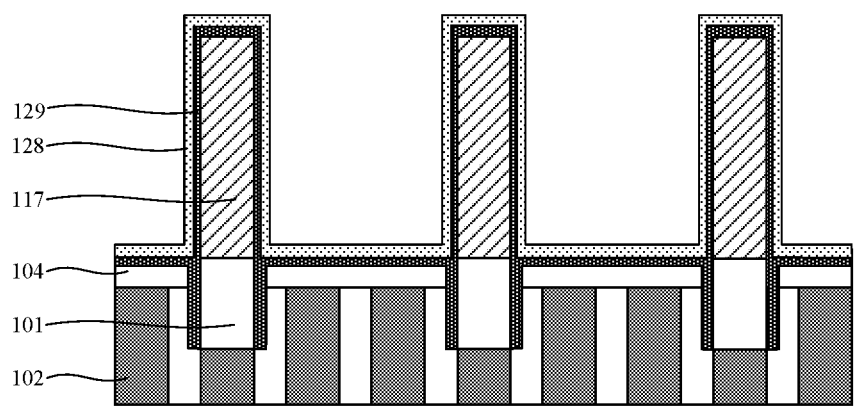
FIG. 7 is a seventh schematic illustration corresponding to a step in the manufacturing method of the memory provided by the first embodiment of the present disclosure.

Referring to FIG. 7, an initial spacer film 128 is formed by a deposition process, covering the sidewalls of the bit line contact layer 101, the sidewalls and top of the dummy bit line structure 117 and the top of the second isolation layer 104.

An initial dielectric film 129 is formed on the surface of the initial spacer film 128 by a deposition process.

Figure 8:
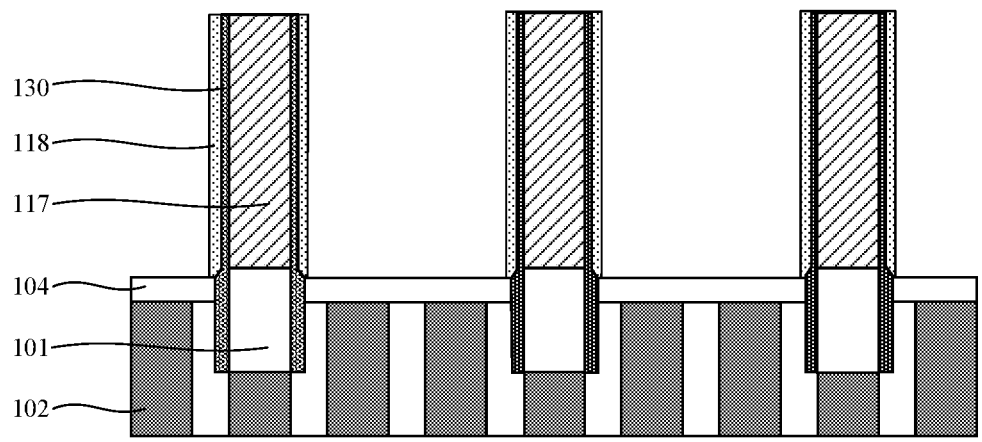
FIG. 8 is an eighth schematic illustration corresponding to a step in the manufacturing method of the memory provided by the first embodiment of the present disclosure.

Referring to FIG. 8, the initial spacer film 128 on top of the dummy bit line structure 117 and on top of the second isolation layer 104 is removed (refer to FIG. 7), thereby forming a spacer layer 130 on the sidewalls of the dummy bit line structure 117 and the sidewalls of the bit line contact layer.

The initial dielectric film 129 on top of the dummy bit line structure 117 and on top of the second isolation layer 104 (refer to FIG. 7) is removed, thereby forming a dielectric layer 118 on the sidewall of the spacer layer 130.

The spacer layer 130 and the dielectric layer 118 can protect the bit line conductive portion and ensure the accuracy of the topography and size of the bit line conductive portion during the subsequent etching process of removing the sacrificial layer.

The material of the dielectric layer 118 includes a low dielectric constant material which can reduce the parasitic capacitance of the memory and increase the operating speed of the memory.

Figure 9:
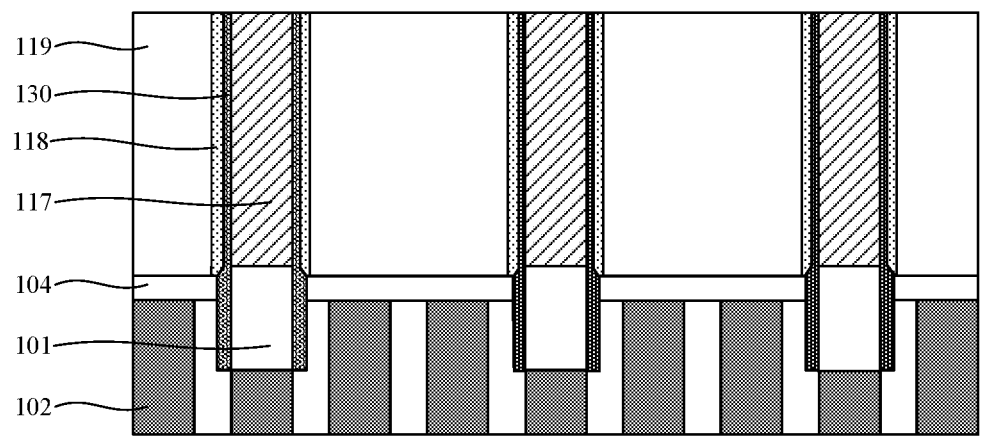
FIG. 9 is a ninth schematic illustration corresponding to a step in the manufacturing method of the memory provided by the first embodiment of the present disclosure.

Referring to FIG. 9, the sacrificial layer 119 is formed wherein it fills the region between adjacent dummy bit line structures 117, and the sacrificial layer 119 covers the sidewall of the dielectric layer 118.

The sacrificial layer 119 also covers the surface of the second isolation layer 104.

Figure 10:
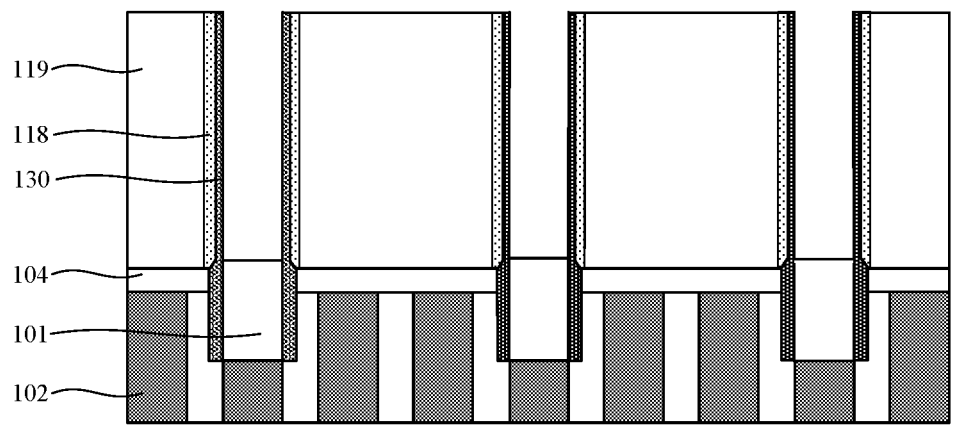
FIG. 10 is a tenth schematic illustration corresponding to a step in the manufacturing method of the memory provided by the first embodiment of the present disclosure.

Referring to FIG. 10, the dummy bit line structure 117 (refer to FIG. 9) is removed and a hole exposing the bit line contact layer 101 is formed.

In some embodiments, the material of the dummy bit line structure 117 is different from the material of the spacer layer 130, the dielectric layer 118, and the sacrificial layer 119, and the etching rate of the dummy bit line structure 117 is higher than the etching rate of the sacrificial layer 119, the dielectric layer 118, and the spacer layer 130, wherein the etching selection ratio of the material of the dummy bit line structure 117 to the material of the sacrificial layer 119, the dielectric layer 118 and the spacer layer 130 is 5-15, for example 8, 10 and 13. The dummy bit line structure 117 is removed by the wet etching process, and hot phosphoric acid solution is used as the etching solvent. In other embodiments, the dummy bit line structure may also be removed by the dry etching process.

Figure 11:
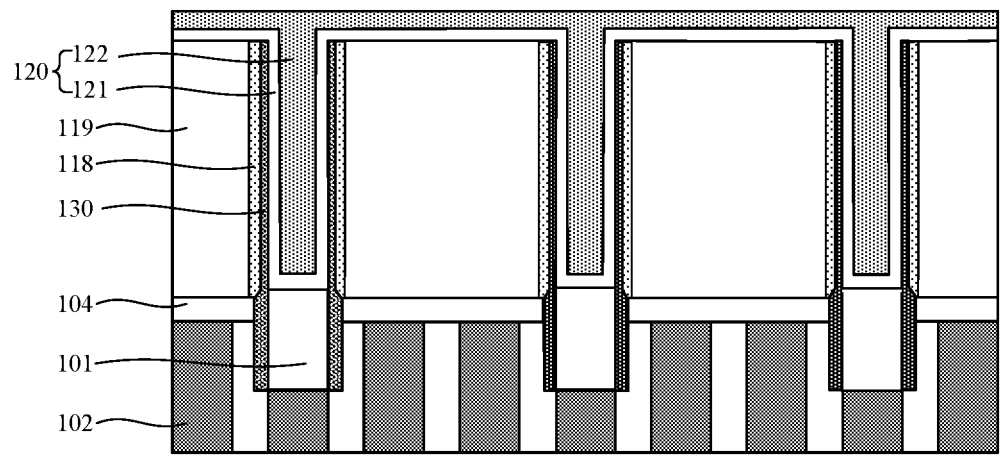
FIG. 11 is an eleventh schematic illustration corresponding to a step in the manufacturing method of the memory provided by the first embodiment of the present disclosure.
Figure 12:
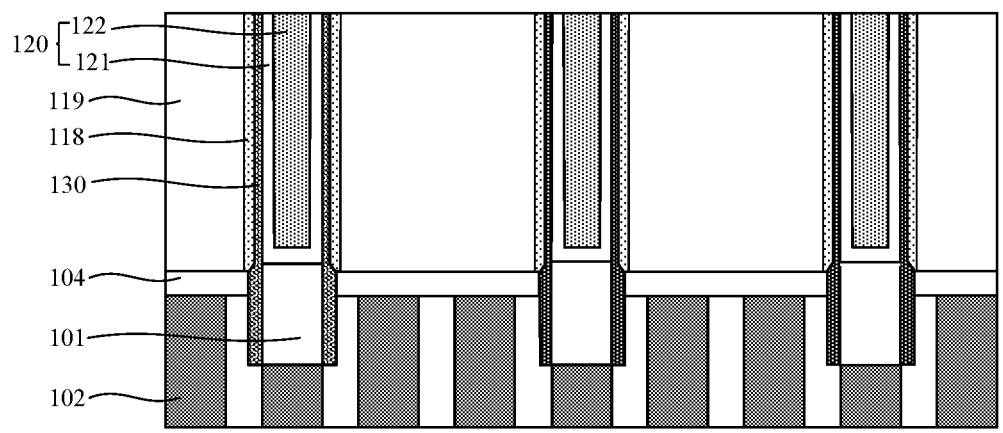
FIG. 12 is a twelfth schematic illustration corresponding to a step in the manufacturing method of the memory provided by the first embodiment of the present disclosure.

Referring to FIGS. 11 and 12, the bit line conductive portion 120 is formed wherein it fills the hole and covers the bit line contact layer 101.

The bit line conductive portion 120 is a conductive structure in the bit line structure. The bit line conductive portion 120 is formed by filling the hole and is supported by the sacrificial layers 119 during its formation process. Accordingly, even if the width of the bit line conductive portion 120 is small, tilt or collapse is not prone to occur. In addition, since the etching process is not adopted, impurities generated by etching are not left in the bit line conductive portion 120; hence, the resistance of the bit line conductive portion 120 is reduced, and the operating speed of the memory is increased.

The formation of the bit line conductive portion 120 comprises the steps of: forming a barrier layer 121 at the bottom of and on the sidewalls of the hole; and forming a conductive layer 122 which fills the hole on the surface of the barrier layer 121.

In an exemplary embodiment, the thickness of the conductive layer 122 and the barrier layer 121 formed by the atomic layer deposition technique is more uniform. In other embodiments, other deposition techniques may also be employed.

The material of the barrier layer 121 comprises one or both of tantalum nitride or titanium nitride. The tantalum nitride or titanium nitride can be conductive, and has a good blocking ability to block the diffusion of the conductive layer 122. The material of the conductive layer 122 comprises one or more of ruthenium, tungsten, gold or silver. Ruthenium, tungsten, gold or silver are all low-resistance metals which can further reduce the resistance of the conductive layer 122 and increase the operating speed of the memory.

In other embodiments, the bit line conductive portion may also have a single layer structure.

In some embodiments as shown in FIG. 11, the conductive layer 122 and the barrier layer 121 are formed further on top surfaces of the sacrificial layer 119, the spacer layer 130 and the dielectric layer 118; and as shown in FIG. 12, a planarization process is performed on the bit line conductive portion 120 to remove the conductive layer 122 and the barrier layer 121 higher than the top surfaces of the sacrificial layer 119, the spacer layer 130 and the dielectric layer 118 (refer to FIG. 11).

In the exemplary embodiment, the bit line conductive portion 120 is planarized by a chemical mechanical polishing process.

Figure 13:
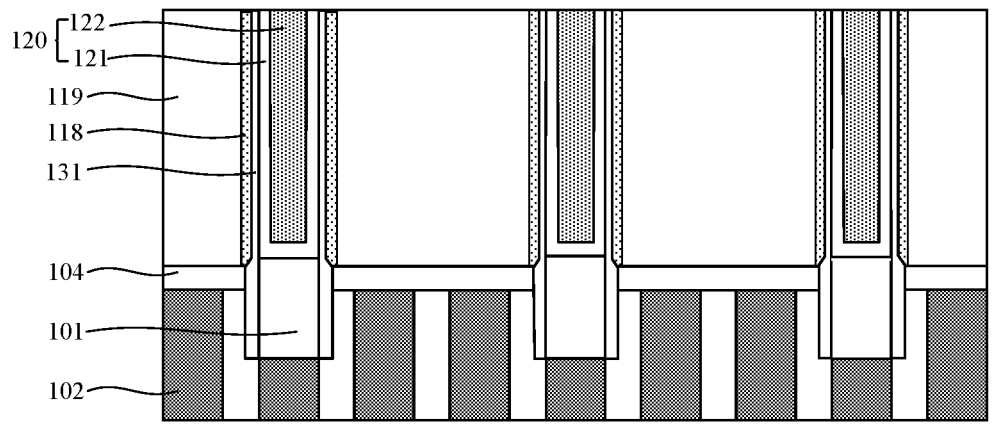
FIG. 13 is a thirteenth schematic illustration corresponding to a step in the manufacturing method of the memory provided by the first embodiment of the present disclosure.

Referring to FIG. 13, after the bit line conductive portion 120 is formed, the spacer layer 130 is removed (refer to FIG. 12) to form the gap 131 between the dielectric layer 118 and the bit line conductive portion 120.

In an exemplary embodiment, the spacer layer 130 located on the sidewall of the bit line contact layer 101 is removed. In other embodiments, the spacer layer located on the sidewall of the bit line contact layer may be preserved.

The material of the spacer layer 130 is different from that of the dielectric layer 118 and the sacrificial layer 119, the etching rate of the spacer layer 130 is higher than that of the dielectric layer 118 and the sacrificial layer 119, and the etching selection ratio of the spacer layer 130 to the dielectric layer 118 and the sacrificial layer 119 is 5-15. Accordingly, in this embodiment the spacer layer 130 may be removed by wet etching process wherein the gap 131 are formed. In other embodiments, the spacer layer may also be removed by dry etching process.

The material of the spacer layer 130 comprises silicon nitride, silicon oxide, silicon oxynitride, or silicon carbon-nitride.

Figure 14:
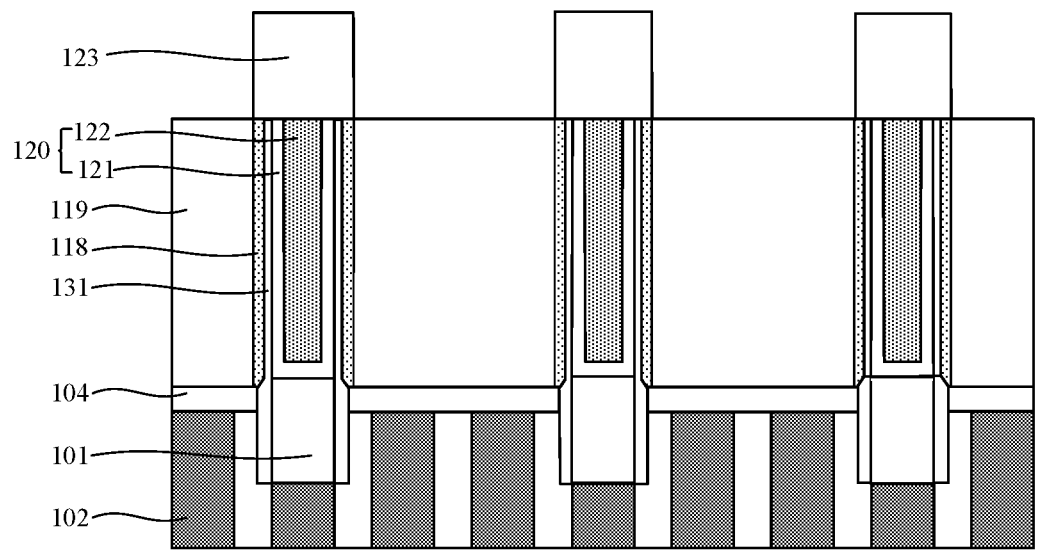
FIG. 14 is a fourteenth schematic illustration corresponding to a step in the manufacturing method of the memory provided by the first embodiment of the present disclosure.

Referring to FIG. 14, an insulating cap layer 123 is formed on top of the bit line conductive portion 120 and the dielectric layer 118.

In some embodiments, the insulating cap layer 123 is also located on top of the gap 131. Since the gap is narrow and elongated, an excessive amount of insulating material is not left in the gap 131 during the process of depositing the insulating material to form the insulating cap layer 123.

The insulating cap layer 123 serves as an insulating structure in the bit line structure.

In an exemplary embodiment, the insulating cap layer 123 is formed by the SADP process which ensures a more precise size for the insulating cap layer 123.

Figure 15:
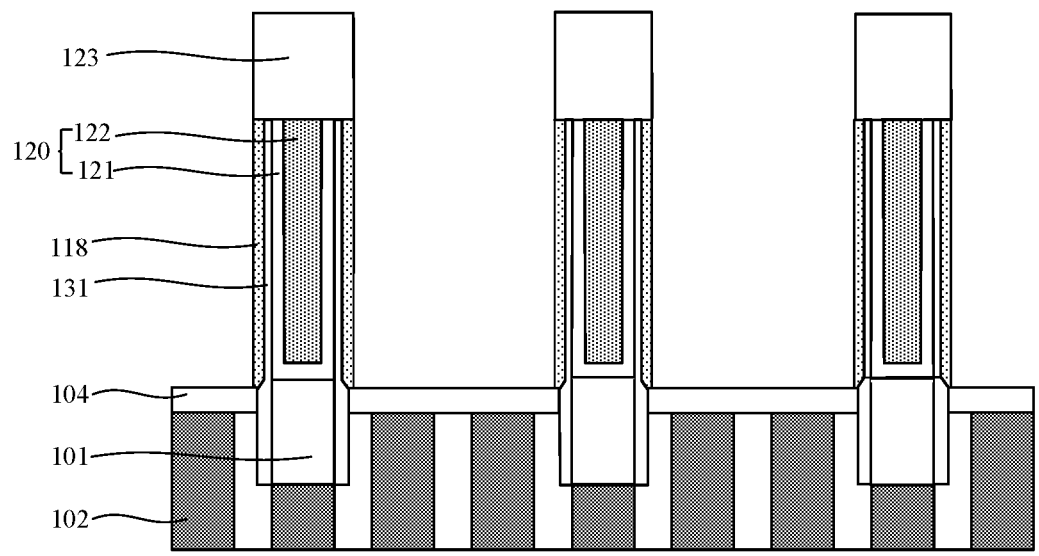
FIG. 15 is a fifteenth schematic illustration corresponding to a step in the manufacturing method of the memory provided by the first embodiment of the present disclosure.

Referring to FIG. 15, after the insulating cap layer 123 is formed, the sacrificial layer 119 is removed (see FIG. 14).

The etching rate of the sacrificial layer 119 is higher than that of the insulating cap layer 123, and the etching selection ratio of the material of the sacrificial layer 119 to the material of the insulating cap layer 123 is 5-15, for example 8, 10, 13. The high etch selection ratio ensures that the insulating cap layer 123 retains its original shape and size during the removal of the sacrificial layer 119. In this embodiment, the sacrificial layer 119 is removed by wet etching process, and hydrofluoric acid solution is utilized as the etching reagent. In other embodiments, the sacrificial layer may also be removed by dry etching process.

Figure 16:
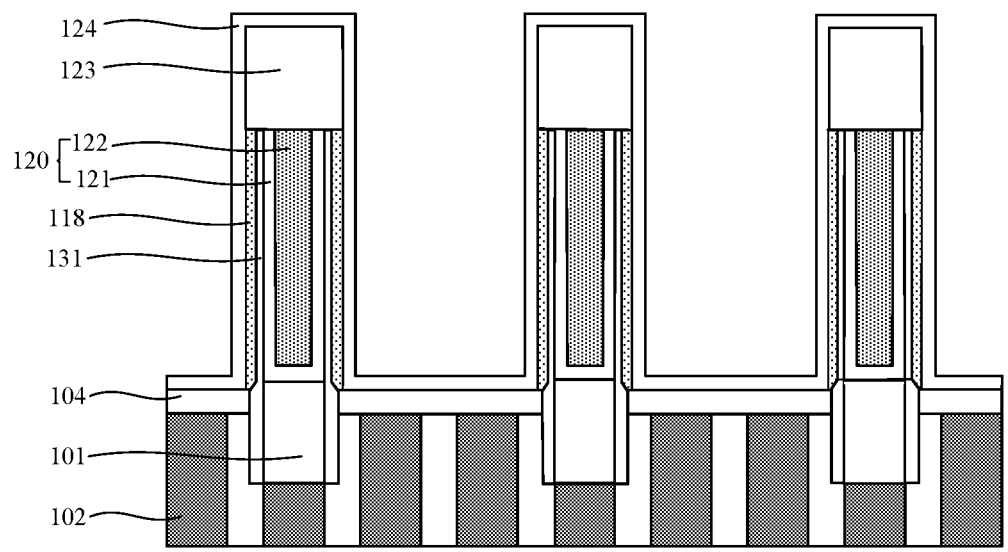
FIG. 16 is a sixteenth schematic illustration corresponding to a step in the manufacturing method of the memory provided by the first embodiment of the present disclosure.

Referring to FIG. 16, a protective layer 124 is formed on the surfaces of the dielectric layer 118 and the insulating cap layer 123.

In some embodiments, the protective layer 124 is also formed on the surface of the second isolation layer 104.

In this embodiment the protective layer 124 is formed using atomic layer deposition technique.

The material of the protective layer 124 comprises silicon carbon-nitride.

To sum up, in some embodiments of the present disclosure, there is a gap 131 between the bit line conductive portion 120 and the dielectric layer 118, which can reduce parasitic capacitance, thereby increasing the reaction speed of the memory and reducing the power consumption of the memory; in addition, the bit line conductive section 120 has a low resistance, and the memory has a high operating speed; in addition, as the bit line conductive portion 120 is supported by the sacrificial layers 119 during its formation, the bit line conductive portion 120 is not prone to tilt or collapse, and the yield and service life of the memory are further improved.

Figure 17:
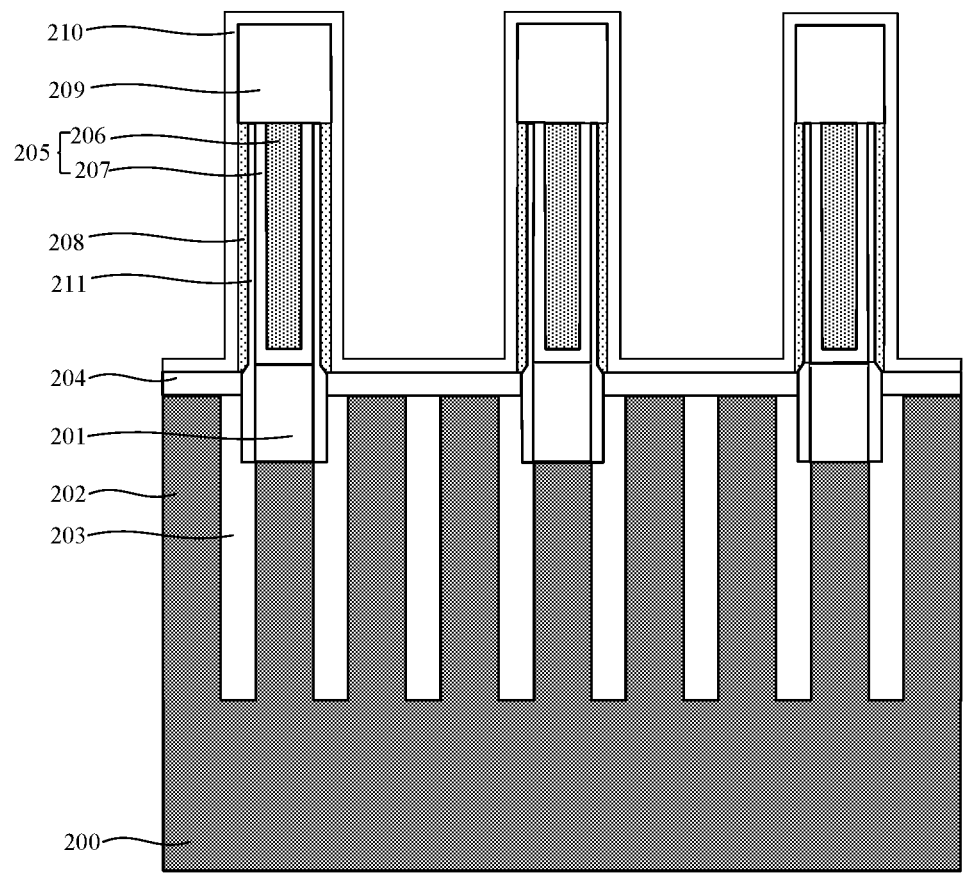
FIG. 17 is a schematic illustration of the memory provided by a second embodiment of the present disclosure.

The second embodiment of the present disclosure also provides a memory which can be manufactured by the manufacturing method thereof in the first embodiment. FIG. 17 is a schematic illustration of the memory provided in this embodiment.

Referring to FIG. 17, the memory comprises: a substrate 200 having a plurality of active regions 202 within it, and a plurality of discrete bit line contact layers 201 each of which is electrically connected to the active region 202; a bit line conductive portion 205 located on top of the bit line contact layer 201; a dielectric layer 208 located on the periphery of the sidewall of the bit line conductive portion 205; and a gap 211 between the dielectric layer 208 and the bit line conductive portion 205.

The memory provided by the present embodiment will be described in detail below with reference to the accompanying drawings.

Between adjacent active regions 202, a first isolation layer 203 is also comprised for isolating the active regions 202.

The surface of the substrate 200 also comprises a second isolation layer 204 for isolating the bit line contact layer 201.

The bit line conductive portion 205 further comprises: a conductive layer 206 located on top of the bit line contact layer 201; and a barrier layer 207 located between the bit line contact layer 201 and the conductive layer 206, wherein the barrier layer 207 also covers a sidewall of the conductive layer 206.

The material of the conductive layer 206 comprises one or more of ruthenium, tungsten, gold, or silver. Ruthenium, tungsten, gold, or silver are all low-resistance metals which can reduce the resistance of the conductive layer 206 and increase the operating speed of the memory.

The material of the barrier layer 207 is a conductive material, which may be, for example, tantalum nitride or titanium nitride.

The barrier layer 207 has a thickness of 2.5-6 nm, for example maybe 3 nm, and the barrier layer 207 of this thickness has a good ability to block the diffusion of the conductive layer 206.

The dielectric layer 208 is made of a low-dielectric constant material.

An insulating cap layer 209 located on top of the bit line conductive portion 205 and the dielectric layer 208; and a protective layer 210 located on the surfaces of the insulating cap layer 209 and the dielectric layer 208, wherein the protective layer 210 is also formed on the surface of the second isolation layer 204.

To sum up, the dielectric layer 208 in some embodiments of the present disclosure is made of a low-dielectric constant material which can reduce the parasitic capacitance. Between the bit line conductive portion 205 and the dielectric layer 208 is the gap 211 which can further reduce the parasitic capacitance, increase the operating speed of the memory, and reduce the power consumption of the memory. In addition, as the conductive layer 206 is made of a low-resistance material such as ruthenium, tungsten, gold, or silver, the conductive layer 206 has a low resistance and the memory has a high operating speed.

It will be apparent to one of ordinary skill in the art that the above-described embodiments are specific embodiments to implement the present disclosure and that in practical application various revisions in form and detail may be made thereto without departing from the spirit and scope of the present disclosure. Any person skilled in the art may make their own revisions and modifications without departing from the spirit and scope of the present disclosure, so the scope of protection of the present disclosure shall be subject to the scope defined by the claims.

What is claimed is:

1. A manufacturing method of a memory comprising:
   providing a substrate and a plurality of discrete bit line contact layers, wherein the substrate has a plurality of active regions therein, and each of the bit line contact layers is electrically connected with the active region;
   forming a dummy bit line structure on top of the bit line contact layer;
   forming a spacer layer on the sidewall of the dummy bit line structure and the sidewall of the bit line contact layer;
   forming a dielectric layer on the sidewall of the spacer layer;
   forming a sacrificial layer that fills the region between adjacent dummy bit line structures, wherein the sacrificial layer covers the sidewall of the dielectric layer;
   removing the dummy bit line structure after the sacrificial layer is formed, and forming a hole exposing the bit line contact layer;
   forming a bit line conductive portion which fills the hole and covers the bit line contact layer;
   and removing the spacer layer after the bit line conductive portion is formed, and forming a gap between the dielectric layer and the bit line conductive portion.

2. The manufacturing method of claim 1, wherein a material of the spacer layer differs from the material of the dielectric layer, the dummy bit line structure and the sacrificial layer.

3. The manufacturing method of claim 2, wherein a material of the spacer layer comprises silicon nitride, silicon oxide, silicon oxynitride, or silicon carbonitride.

4. The manufacturing method of claim 2, wherein a material of the dielectric layer comprises a low-dielectric constant material.

5. The manufacturing method of claim 1, wherein said forming the dummy bit line structure comprises: forming on the substrate a dummy bit line layer which covers the bit line contact layer; forming a patterned mask layer on the dummy bit line layer; and etching the dummy bit line layer with the patterned mask layer as a mask to form a dummy bit line structure.

6. The manufacturing method of claim 5, wherein said forming the patterned mask layer comprises: forming a plurality of discrete core portions on the dummy bit line layer; forming a sidewall film which covers the top and sidewall of the core portion and the dummy bit line layer; etching the sidewall film to form a sidewall layer located on the opposing sidewalls of the core portion; and removing the core portion to make the sidewall layer the patterned mask layer.

7. The manufacturing method of claim 1, wherein in a process of removing the dummy bit line structure, an etching selection ratio of a material of the dummy bit line structure to a material of the sacrificial layer, the dielectric layer and the spacer layer is 5-15.

8. The manufacturing method of claim 7, wherein the material of the dummy bit line structure comprises silicon nitride, silicon oxynitride, or silicon carbonitride.

9. The manufacturing method of claim 7, wherein the material of the sacrificial layer comprises silicon oxide.

10. The manufacturing method of claim 1, wherein said forming the bit line conductive portion comprises: forming a barrier layer at the bottom and on the side wall of the hole; and forming on the surface of the barrier layer the conductive layer which fills the hole.

11. The manufacturing method of claim 10, wherein a material of the conductive layer comprises one or more of ruthenium, tungsten, gold, or silver.

12. The manufacturing method of claim 10, wherein a material of the barrier layer comprises one or both of tantalum nitride or titanium nitride.

13. The manufacturing method of claim 10, wherein the conductive layer and the barrier layer are further located on top surfaces of the sacrificial layer, the spacer layer and the dielectric layer; and the step of forming the bit line conductive portion further comprises: planarizing the bit line conductive portion to remove the conductive layer and the barrier layer higher than the top surfaces of the sacrificial layer, the spacer layer and the dielectric layer.

14. The manufacturing method of claim 1, wherein after the gap is formed, the method further comprises: forming an insulating cap layer on top of the bit line conductive portion and the dielectric layer; removing the sacrificial layer after the insulating cap layer is formed; and forming a protective layer on the surfaces of the dielectric layer and the insulating cap layer after the sacrificial layer is removed.

15. The manufacturing method of claim 14, wherein, in a process of removing the sacrificial layer, the etching selection ratio of a material of the sacrificial layer to a material of the insulating cap layer is 5-15.

16. A memory manufactured using the manufacturing method of claim 1, comprising:
   a substrate and a plurality of discrete bit line contact layers, wherein the substrate has a plurality of active regions within it and each of the bit line contact layers is electrically connected with the active region;
   a bit line conductive portion located on top of the bit line contact layer;
   a dielectric layer located on the periphery of the sidewall of the bit line conductive portion;
   and a gap between the dielectric layer and the bit line conductive portion.

* * * * *